United States Patent
Kwon et al.

(10) Patent No.: US 7,738,297 B2
(45) Date of Patent: Jun. 15, 2010

(54) METHOD AND APPARATUS FOR CONTROLLING TWO OR MORE NON-VOLATILE MEMORY DEVICES

(75) Inventors: Oh Suk Kwon, Yongin-si (KR); Sung Soo Lee, Seongnam-si (KR); Duck Kyeun Woo, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

(21) Appl. No.: 12/036,416

(22) Filed: Feb. 25, 2008

(65) Prior Publication Data

US 2008/0205153 A1    Aug. 28, 2008

(30) Foreign Application Priority Data

Feb. 23, 2007    (KR)    ...................... 10-2007-0018646

(51) Int. Cl.
    G11C 16/04    (2006.01)
(52) U.S. Cl. .............................. 365/185.11; 365/185.17
(58) Field of Classification Search ............ 365/185.11, 365/185.17
    See application file for complete search history.

(56) References Cited

U.S. PATENT DOCUMENTS

| | | | |
|---|---|---|---|
| 6,262,918 B1 * | 7/2001 | Estakhri et al. | ........ 365/185.33 |
| 6,861,867 B2 | 3/2005 | West et al. | |
| 2006/0136687 A1 * | 6/2006 | Conley et al. | ................ 711/162 |
| 2008/0205153 A1 * | 8/2008 | Kwon et al. | ........... 365/185.18 |

FOREIGN PATENT DOCUMENTS

| | | |
|---|---|---|
| JP | 61280100 | 12/1986 |
| JP | 63279614 | 11/1988 |
| KR | 100243718 B | 3/2000 |

* cited by examiner

*Primary Examiner*—Hoai V Ho
(74) *Attorney, Agent, or Firm*—Volentine & Whitt, PLLC

(57) ABSTRACT

A method and apparatus for controlling two or more non-volatile memory devices includes activating a read enable signal or a write enable signal, which is input to the first and second non-volatile memory devices, using a controller. A first chip enable signal is alternately activated for selecting the first non-volatile memory device and a second chip enable signal is activated for selecting the second non-volatile memory device using the controller. This is done while the read enable signal or the write enable signal is input to the first and second non-volatile memory devices being activated. Accordingly, even when the minimum cycle of the controller is longer than that of a memory device read/write time is reduced, thereby improving read/write performance.

17 Claims, 7 Drawing Sheets

METHOD AND APPARATUS FOR CONTROLLING TWO OR MORE NON-VOLATILE MEMORY DEVICES

CROSS-REFERENCE TO RELATED PATENT APPLICATION

This application claims the benefit of Korean Patent Application No. 10-2007-0018646, filed on Feb. 23, 2007, in the Korean Intellectual Property Office, the disclosure of which is incorporated herein in its entirety by reference.

BACKGROUND OF THE INVENTION

1. Field of the Invention

Embodiments of the invention relate to a semiconductor device. More particularly, embodiments of the invention relate to a method and apparatus for controlling two or more non-volatile memory devices.

2. Discussion of Related Art

Read and write speeds associated with semiconductor memory devices influence overall system speeds. Non-volatile memory devices include read-only memories (ROM), electrically erasable and programmable ROM (EEPROM), and erasable and programmable ROM (EPROM) devices. Because EEPROMs can electrically erase and program data, they have been used for system programming applications requiring continuous updates or auxiliary memory devices. In particular, flash EEPROM devices (hereinafter, referred to as flash memory devices) have a higher degree of integration than existing EEPROM devices and may be used for large-capacity auxiliary memory devices.

FIG. 1 is a block diagram of a memory system 10 including a plurality of conventional semiconductor memory devices 11, 12, 13, and 14. Each of the semiconductor memory devices 11-14 is a NAND flash memory device which includes an input/output (I/O) pin for inputting/outputting 8-bit I/O data I/O[7:0], a plurality of pins (i.e., nCEi pins, nRE pins, and nWE pins) for receiving a plurality of control signals nCEi (where i=1, 2, 3, or 4), nRE, and nWE, and a ready/busy (R/B) pin. A chip enable signal nCEi selects one of the semiconductor memory devices 11-14. Different chip enable signals nCEi are used to select different semiconductor memory devices 11-14, respectively. When the chip enable signal nCEi is at a high logic level, the semiconductor memory device receiving the chip enable signal nCEi is in standby mode. When the chip enable signal nCEi is at a low logic level, the selected semiconductor memory device is in an active mode. Read enable signal nRE controls data output. After a predetermined period of time after the falling edge of read enable signal nRE, data I/O[7:0] is sequentially output. Write enable signal nWE controls the input of an address, command or data signal. The command, address or data signal is latched in response to a rising edge of write enable signal nWE. The I/O pin is also used to input the address and command signals.

NAND flash memory devices can use input pins in common for an address, command and data signals because a data I/O period and an address/command input period are separated in the time domain. When a chip (or a memory device) is not selected or when outputting is impossible, the I/O pin is floated with high impedance. The R/B pin is an output pin for reporting the operating state of a memory device to a controller. The R/B pin is at a low level while the memory device is performing a program, erase or read operation and returns to the high level when the operation is completed.

FIG. 2 is a timing diagram of signals when data is output from the memory system 10 illustrated in FIG. 1. Generally, data read and program operations are performed in units of pages in NAND flash memory devices. Accordingly, when one-data page is read from each of the NAND flash memory devices 11-14, first memory device 11 is selected and one-page of data is read from the first memory device 11 and then the second memory device 12 is selected and one-page of data is read from the second memory device 12. In a state where first memory device 11 is selected by activating the first chip enable signal nCE1 for a predetermined period of time (e.g., time needed to read one-page data), the read enable signal nRE is toggled so that the one-page of data is read from first memory device 11. In a state where second memory device 12 is selected by activating the second chip enable signal nCE2 for the predetermined period of time, read enable signal nRE is toggled so that the one-page of data is read from second memory device 12. The same procedure is performed with respect to the third and fourth memory devices 13 and 14.

As described above, in conventional memory systems a read enable signal is toggled repeatedly while a chip enable signal is activated so that the read or write operation is performed in units of pages. Data I/Ox is output after an access time determined based on a falling edge of the read enable signal nRE. A cycle of the read enable signal nRE may be determined by a minimum cycle of a controller (not shown) for controlling memory devices 11-14 or test equipment (not shown). When the minimum cycle of the controller or the test equipment is 80 ns, the cycle of the read enable signal nRE cannot be shorter than 80 ns as illustrated in FIG. 2. Thus, the read cycle is also 80 ns. Accordingly, it takes 655,360 ns (=80 ns×2048×4 (the number of chips)) to read one-page of data from all of the memory devices 11-14.

FIG. 3 is a timing diagram of signals when data is written (or input) to the memory system 10 illustrated in FIG. 1. This timing diagram is similar to that illustrated in FIG. 2, with the exception that the write enable signal nWE is toggled instead of the read enable signal nRE. Input data I/Ox is latched in response to a rising edge of the write enable signal nWE. A write cycle is determined based on the operating cycle of a controller or test equipment. When the write cycle is 80 ns, it takes 655,360 ns (=80 ns×2048×4 (the number of chips)) to write one-page of data to all of the memory devices 11 through 14. According to the above-described conventional memory devices, even when the operating cycle of a memory device is shorter than that of a controller or test equipment, the read/write speed is determined by the operating cycle of the controller or the test equipment. As a result, read/write performance may be degraded.

SUMMARY OF THE INVENTION

Exemplary embodiments of the present invention are directed to a method and apparatus for controlling two or more non-volatile memory devices. In an exemplary embodiment, the method for controlling a first non-volatile memory device and a second non-volatile memory device includes activating a read enable signal or a write enable signal input to the first and second non-volatile memory devices using a controller. While activating the read enable or write enable signals, alternately activating a first chip enable signal for selecting the first non-volatile memory device and a second chip enable signal for selecting the second non-volatile memory device using the controller.

In another exemplary embodiment, an apparatus for controlling at least two non-volatile memory devices includes a control unit and a memory interface unit. The control unit is configured to determine whether to write data to the two or more non-volatile memory devices or read data from the at least two non-volatile memory devices. The memory interface unit is coupled to the control unit and is configured to generate a read enable signal, a write enable signal, a first chip enable signal, and a second chip enable signal to access the at least two non-volatile memory devices. The memory interface unit is further configured to alternately activate the first chip enable signal and the second chip enable signal while activating the write enable signal or the read enable signal to a first logic level to alternately select each of the at least two non-volatile memory devices.

DETAILED DESCRIPTION OF THE INVENTION

Figure 1:
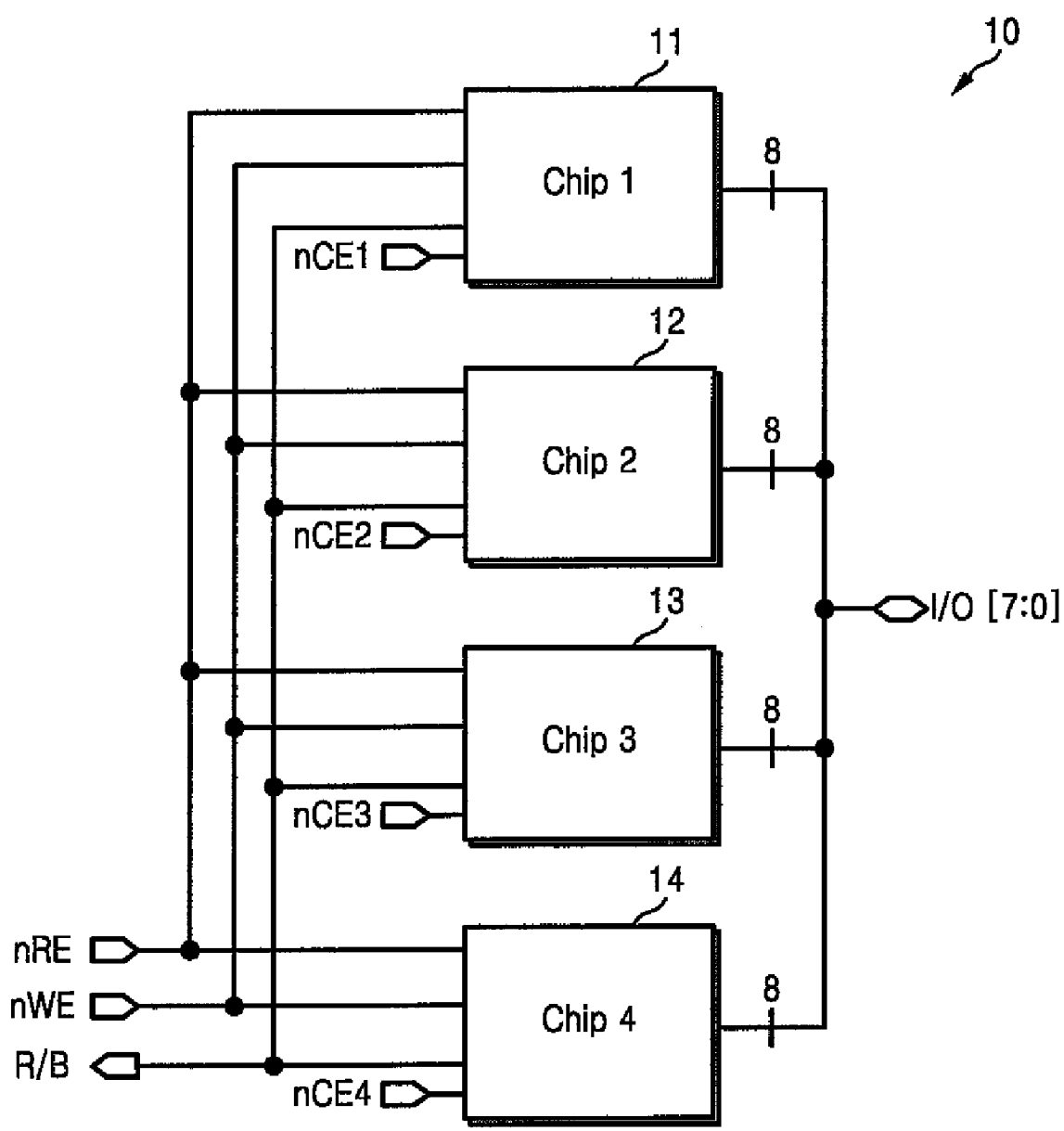
FIG. 1 is a block diagram of a memory system including a plurality of conventional semiconductor memory devices.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 4:
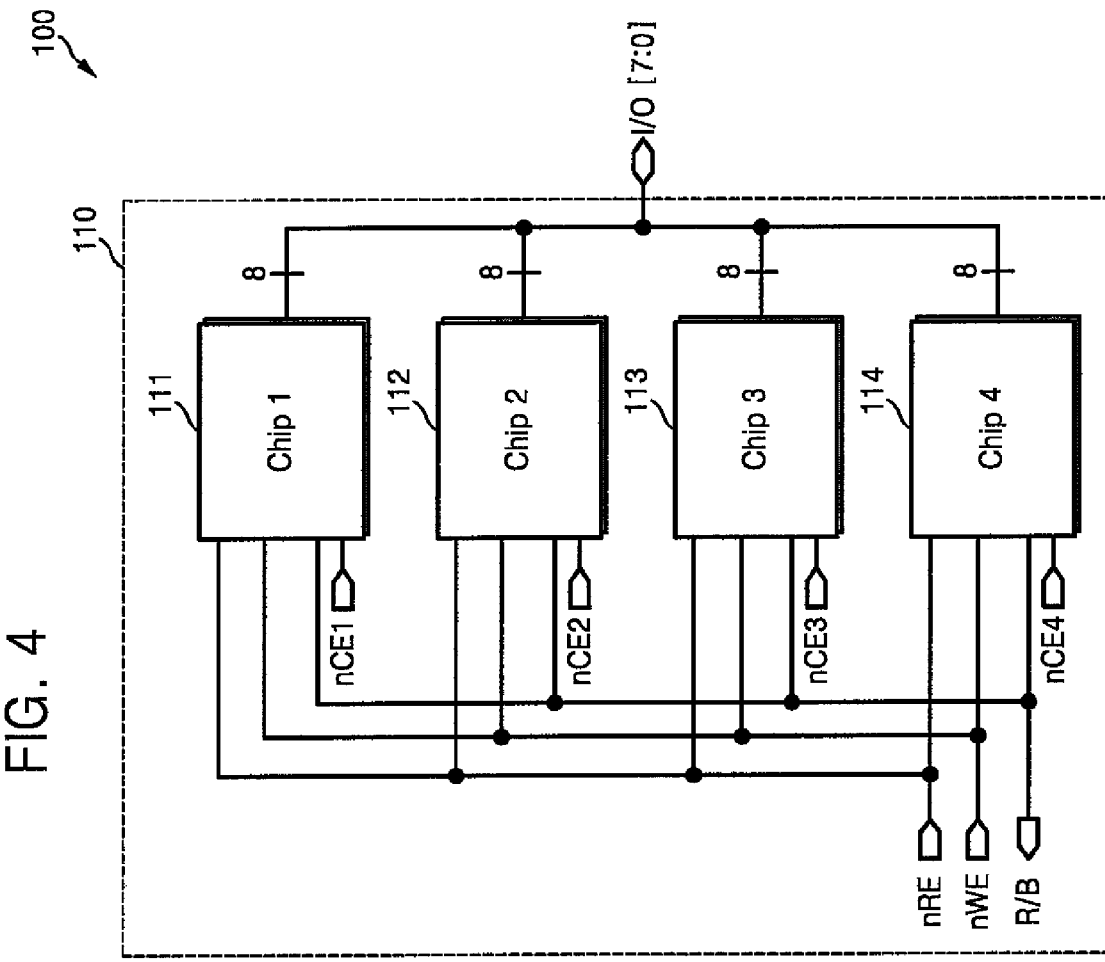
FIG. 4 is a schematic block diagram of a memory system including a plurality of semiconductor memory devices and a controller in accordance with an embodiment of the present invention.
Figure 4:
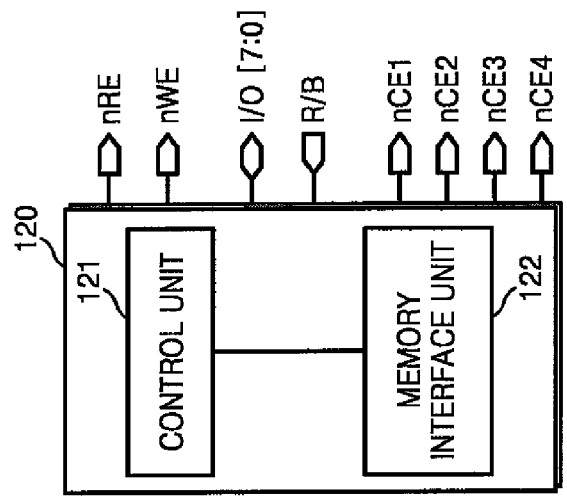

FIG. 4 is a schematic block diagram of a memory system 100 including a plurality of non-volatile memory devices 111, 112, 113, 114 and a controller 120 for controlling the non-volatile memory devices 111-114. Each of the non-volatile memory devices 111 through 114 includes an input/output (I/O) pin to accommodate 8-bit I/O data I/O[7:0], a plurality of pins (i.e., nCEi pins, nRE pins, and nWE pins) for receiving control signals nCEi (where i=1, 2, 3, or 4), nRE, and nWE, and a ready/busy (R/B) pin. Each of the non-volatile memory devices 111-114 may include a command latch enable (CLE) pin for controlling the input of a command, an address latch enable (ALE) pin for controlling the input of an address signal, and a power supply pin. The plurality of the non-volatile memory devices 111-114 may be formed on a single module substrate to define memory module 110.

The non-volatile memory devices 111-114 may share data I/O line, read enable signal nRE line, write enable signal nWE line, and R/B signal line. However, a signal line supplying a chip enable signal nCEi for selecting each of the non-volatile memory devices 111-114 may be independently connected to the respective memory devices. In other words, the non-volatile memory devices 111-114 receive a write enable signal nWE and a read enable signal nRE in common, but may each independently receive the chip enable signals nCEi. In this manner, each of the non-volatile memory devices 111-114 is selectively activated in response to a corresponding one among the chip enable signals nCEi (where i=1, 2, 3, 4). When the chip enable signal nCEi (where i=1, 2, 3, or 4) is high, the non-volatile memory device (111-114) that receives the chip enable signal nCEi is in standby mode. When the chip enable signal nCEi is low, the corresponding non-volatile memory device is in an active mode.

Controller 120 includes control unit 121 and memory interface unit 122. Control unit 121 determines whether to write data to a memory device or read data from the memory device at the request of a host (not shown). Control unit 121 controls memory interface unit 122 to access the non-volatile memory devices 111-114. Memory interface unit 122 is controlled by control unit 121 to generate control signals nRE, nWE, and nCE1 through nCE4 for controlling the non-volatile memory devices 111-114. Memory interface unit 122 also generates a command and an address signal for designating a memory cell on which a data read/write operation is performed. Memory interface unit 122 transmits data to be written to the non-volatile memory devices 111-114 and receives data read from the non-volatile memory devices 111-114.

Figure 5:
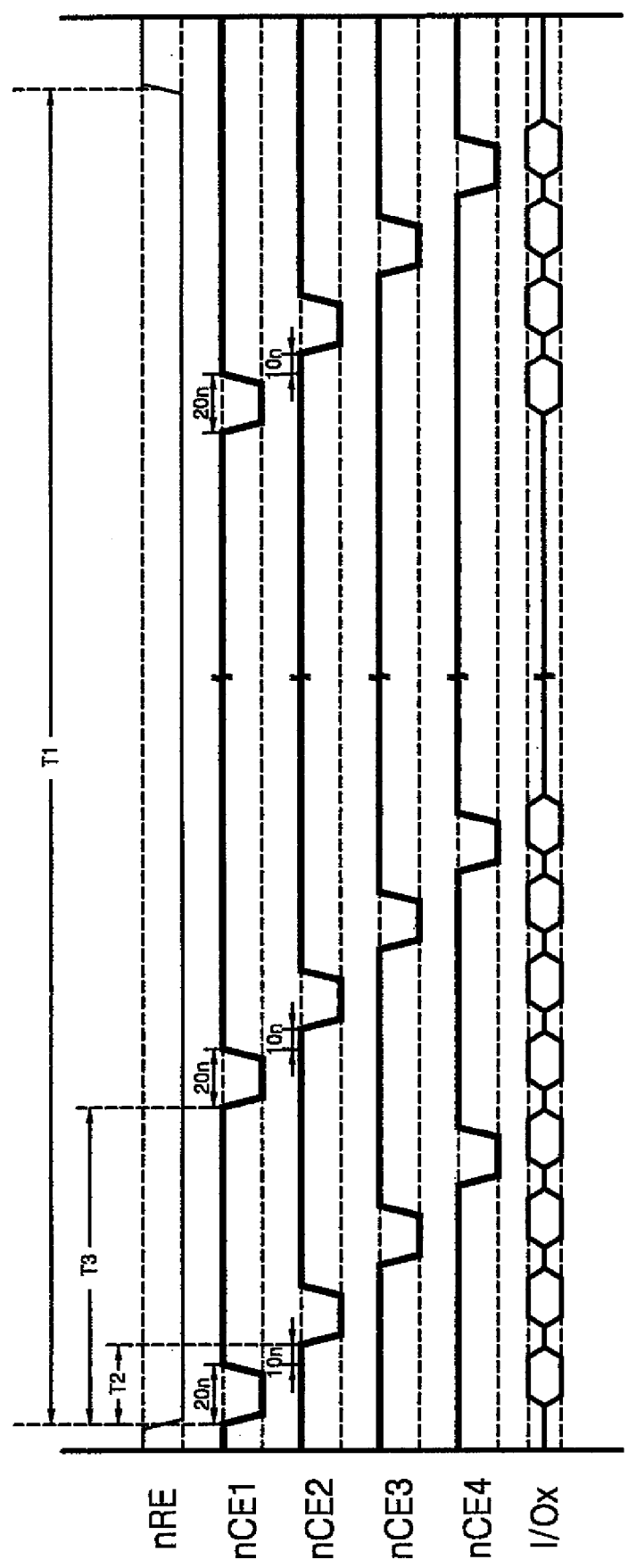
FIG. 5 is a timing chart of signals when data is output from the memory system illustrated in FIG. 4.
Figure 7:
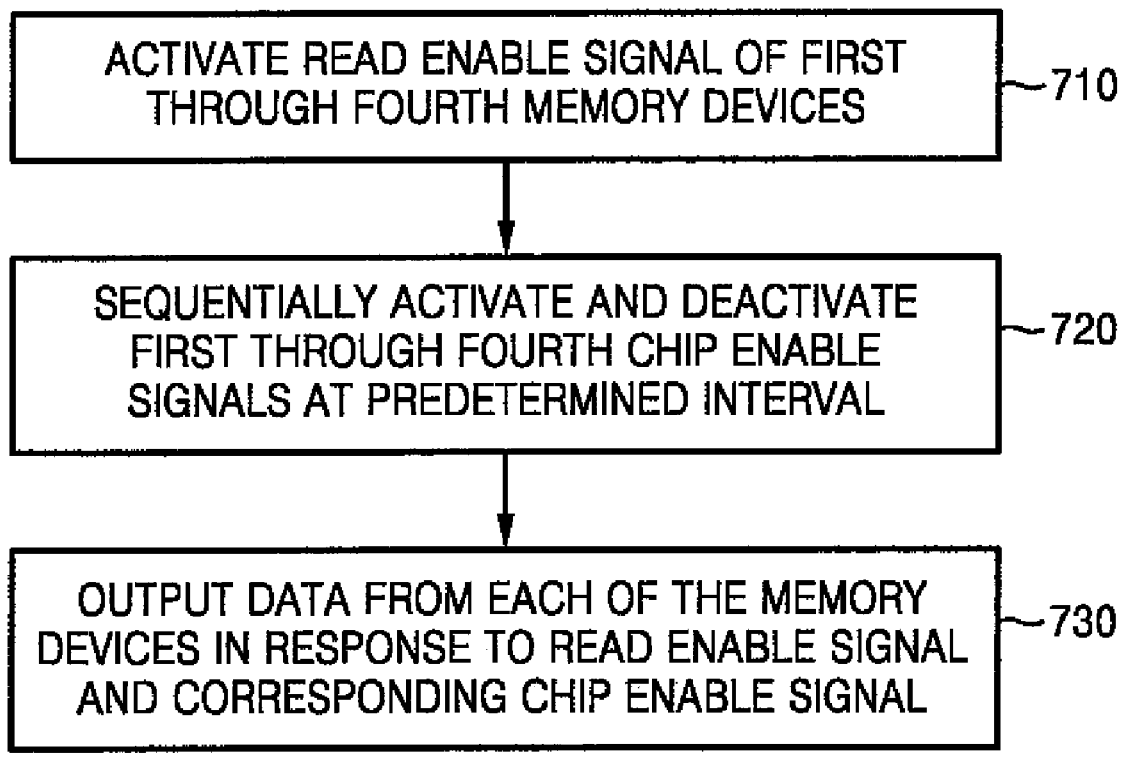
FIG. 7 is a flowchart of a method for controlling two or more non-volatile memory devices according to an embodiment of the present invention.

The operation of the memory system 100 outputting data will be described with reference to FIGS. 4, 5, and 7. FIG. 5 is a timing chart illustrating signals when data is output from memory system 100 and FIG. 7 is a flowchart of a method of controlling two or more non-volatile memory devices. In particular, FIG. 7 illustrates a control method performed when data is read (or output) from the non-volatile memory devices 111-114 in memory system 100. In step 710, controller 120 activates read enable signal nRE which is supplied to each of the memory devices 111-114 into a first logic level (e.g., a low level) during a first time T1. In step 720, controller 120 activates/deactivates the first through fourth chip enable signals nCE1, nCE2, nCE3, and nCE4 at a predetermined interval while read enable signal nRE is activated in order to alternately select the first through fourth memory devices 111-114. For example, controller 120 may sequentially activate and deactivate the first through fourth chip enable signals nCE1, nCE2, nCE3, and nCE4 at an interval of a second time T2. Second time T2 may be equal to a minimum cycle of the memory devices 111-114. In addition, controller 120 may repeatedly activate and deactivate the first through fourth chip enable signals nCE1, nCE2, nCE3, and nCE4 in an interleaving manner for a period of time. In other words, controller 120 may sequentially and repeatedly toggle the first through fourth chip enable signals nCE1, nCE2, nCE3, and nCE4, thereby sequentially selecting the first through fourth memory devices 111-114 multiple times. An interval between activations of the first chip enable signal nCE1 may be a third time T3.

It is assumed that the minimum cycle of the first through fourth memory devices 111-114 is 30 ns and the minimum cycle of controller 120 is 80 ns. As illustrated in FIG. 5, controller 120 may activate the first chip enable signal nCE1 into a first logic level (e.g., a low level) during a predetermined period of time (e.g., about 20 ns) then deactivate the first chip enable signal nCE1 into a second logic level (e.g., a high level), and then activate the second chip enable signal nCE2 after a predetermined period of time (e.g., 10 ns). In this manner, controller 120 may alternately select the first through fourth memory devices 111-114.

Each of the first through fourth memory devices 111-114 is in a standby mode when its nCE pin is high. The first through fourth memory devices 111-114 cannot recognize a signal applied from controller 120 in the standby mode. When the nCE pin is enabled low, the first through fourth memory devices 111-114 are enabled and can respond to the read enable signal nRE applied from controller 120. Accordingly, each of the first through fourth memory devices 111-114 outputs data in response to the activated read enable signal nRE and a corresponding one of the first through fourth chip enable signals nCE1, nCE2, nCE3, and nCE4 in step 730. As a result, controller 120 receives data I/Ox alternately or sequentially output from the first through fourth memory devices 111-114. When the read cycle of the first through fourth memory devices 111-114 is 30 ns, it takes approximately 245,760 ns (=30 ns×2048×4 (the number of chips)) to output 2048 bytes of data (equivalent to a page size). Even when the minimum cycle of controller 120 is greater than that of the first through fourth memory devices 111-114, data can be output in accordance with the read cycle of memory devices 111-114. When the minimum cycle of controller 120 is greater than that of the first through fourth memory devices 111-114 read/write performance of data is not compromised.

Figure 6:
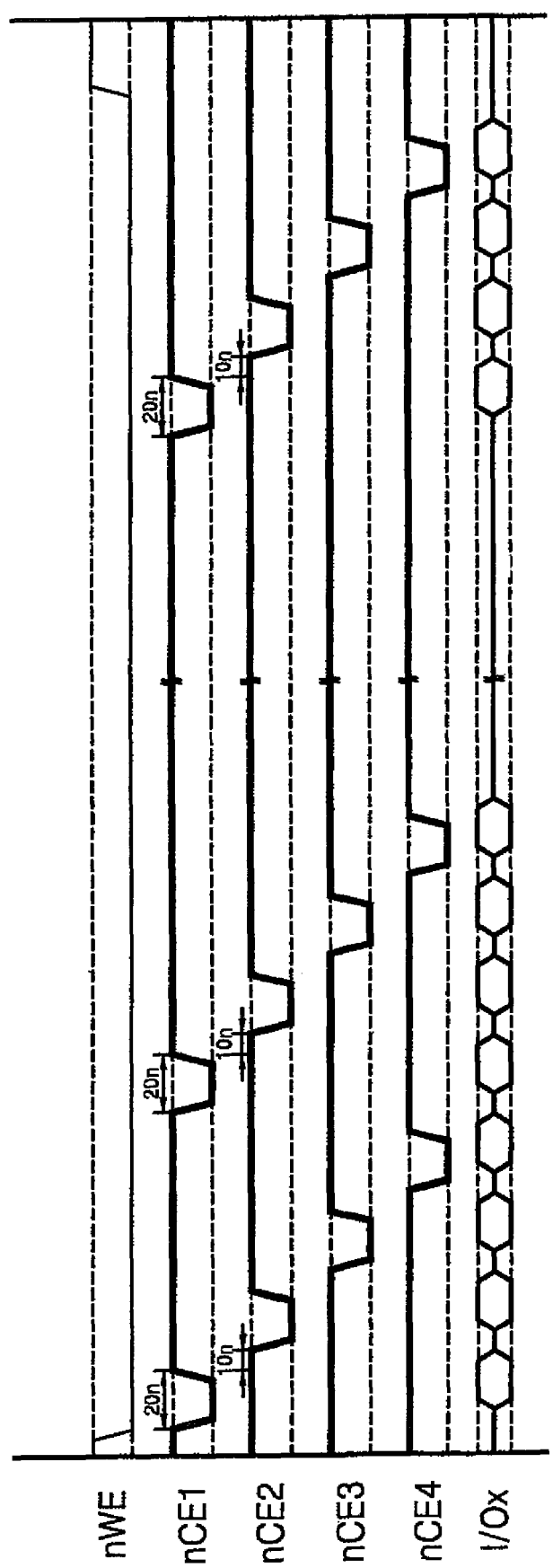
FIG. 6 is a timing chart of signals when data is input to the memory system illustrated in FIG. 4.

FIG. 6 is a timing diagram of signals when data is input to the memory system 100 illustrated in FIG. 4. This timing diagram is similar to that illustrated in FIG. 5, but for the toggling of the write enable signal nWE instead of the read enable signal nRE. In particular, controller 120 activates write enable signal nWE which is commonly input to the first through fourth memory devices 111-114 into a first logic level (e.g., a low level) during a predetermined period of time. While the write enable signal nWE is being activated, controller 120 activates and deactivates the first through fourth chip enable signals nCE1, nCE2, nCE3, and nCE4 at a predetermined interval in order to alternately select the first through fourth memory devices 111-114. Each of the first through fourth memory devices 111-114 latches the data I/Ox output from controller 120 in response to a rising edge of the write enable signal nWE. Each of the first through fourth memory devices 111-114 writes data in response to write enable signal nWE and a corresponding one among the chip enable signals nCE1, nCE2, nCE3, and nCE4, so that the data I/Ox output from controller 120 is alternately or sequentially input to the first through fourth memory devices 111-114.

Figure 2:
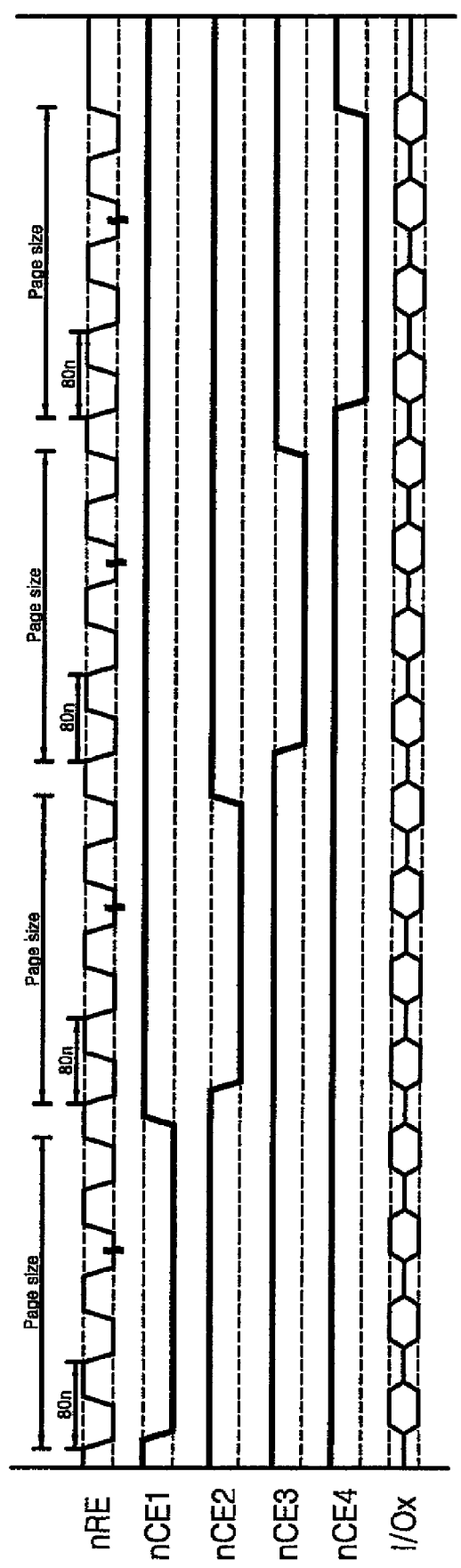
FIG. 2 is a timing chart of signals when data is output from the memory system illustrated in FIG. 1.
Figure 3:
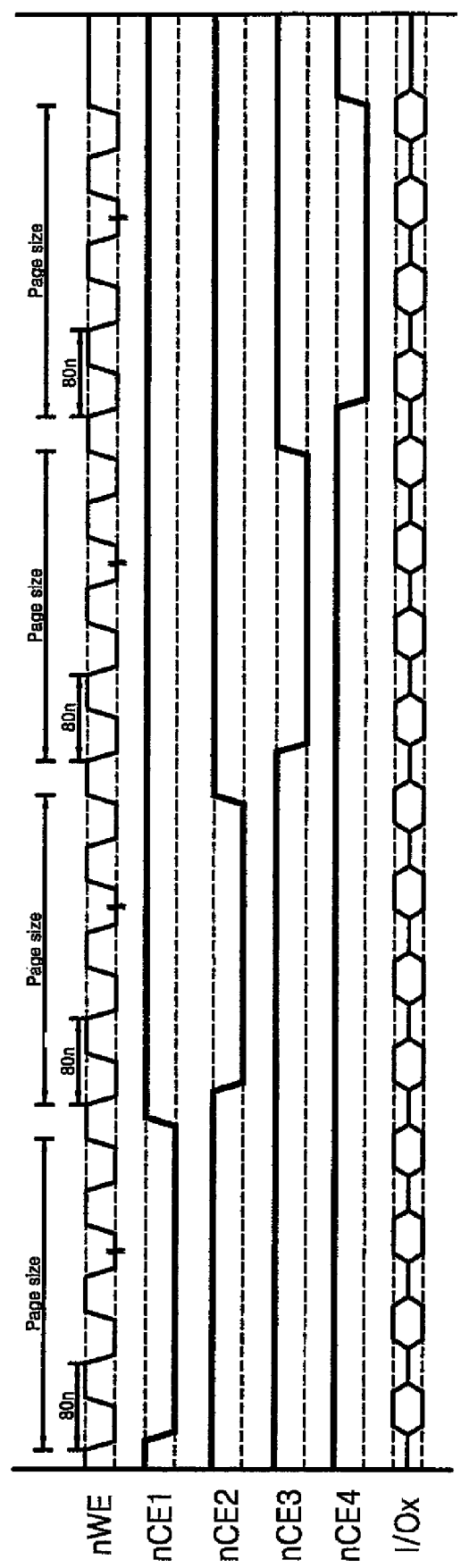
FIG. 3 is a timing chart of signals when data is written (or input) to the memory system illustrated in FIG. 1.

Data can be input/output in accordance with the operating cycle of a memory device regardless of the minimum cycle of the controller. In the conventional memory system as illustrated in FIGS. 1-3, data input/output speed is determined based on the minimum cycle of a controller even when the minimum cycle of a memory device is shorter than that of the controller. Because of the minimum cycle of the controller, the data input/output performance of the memory system is degraded. In accordance with an embodiment of the present invention, even when the minimum cycle of the controller is longer than that of the memory device, read/write time is reduced to improve read/write performance.

The present invention can also be used where test equipment instead of the controller is connected to a plurality of memory devices to test a plurality of memory devices. The test equipment may have a longer operating cycle than the memory devices and the data input/output performance is improved, thereby reducing testing time. As described above, a memory system can have the same data input/output performance as a memory device regardless of the minimum cycle of the controller. Therefore, even when the minimum cycle of the controller is longer than that of the memory device, a read/write time is reduced and improved read/write performance can be realized.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for controlling a first non-volatile memory device and a second non-volatile memory device comprising:
   activating a read enable signal or a write enable signal, which is input to the first and second non-volatile memory devices using a controller; and
   while activating the read enable signal or the write enable signal input to the first and second non-volatile memory devices, alternately activating a first chip enable signal for selecting the first non-volatile memory device and a second chip enable signal for selecting the second non-volatile memory device using the controller,
   wherein alternately activating the first and second non-volatile memory devices further comprises repeatedly toggling the first chin enable signal and the second chip enable signal in an interleaving manner.

2. The method of claim 1 wherein a time interval between a start point of the activation of the first chip enable signal and a start point of the activation of the second chip enable signal is less than a minimum cycle of the controller.

3. The method of claim 1, further comprising:
   outputting data, in response to the read enable signal and a corresponding chip enable signal, among the first and second chip enable signals using each of the first and second non-volatile memory devices; and
   alternately receiving the data output from the first non-volatile memory device and the data output from the second non-volatile memory device using the controller while the read enable signal is being activated.

4. The method of claim 1 further comprising inputting data in response to the write enable signal and a corresponding chip enable signal among the first and second chip enable signals using each of the first and second non-volatile memory devices.

5. The method of claim 1 wherein each of the first and second non-volatile memory devices is a NAND flash memory device.

6. The method of claim 1 wherein the controller is a memory controller.

7. The method of claim 1 wherein the controller is test equipment.

8. An apparatus for controlling at least two non-volatile memory devices, the apparatus comprising:
   a control unit configured to determine whether to write data to the two or more non-volatile memory devices or read data from the at least two non-volatile memory devices; and
   a memory interface unit coupled to the control unit and configured to generate a read enable signal, a write enable signal, a first chip enable signal, and a second chip enable signal to access the at least two non-volatile memory devices, the memory interface unit further configured to alternately activate the first chip enable signal and the second chip enable signal while activating the write enable signal or the read enable signal to a first logic level to alternately select each of the at least two non-volatile memory devices,
wherein the memory interface unit repeatedly toggles the first chin enable signal and the second chin enable signal in an interleaving manner.

9. The apparatus of claim 8 wherein the at least two non-volatile memory devices are NAND flash memory devices.

10. The apparatus of claim 8 wherein the control unit is a memory controller.

11. The apparatus of claim 8 wherein the control unit is test equipment.

12. A memory system comprising:
a first non-volatile memory device and a second non-volatile memory device configured to receive a write enable signal and a read enable signal in common and to independently receive a chip enable signal; and
a controller configured to control the first and second non-volatile memory devices, wherein controlling the first and second non-volatile memory devices comprises activating the read enable signal or the write enable signal applied to the first and second non-volatile memory devices, and alternately activating a first chip enable signal selecting the first non-volatile memory device and a second chin enable signal selecting the second non-volatile memory device, wherein alternately activating the first and second non-volatile memory devices comprises repeatedly toggling the first chip enable signal and the second chip enable signal in an interleaving manner.

13. The apparatus of claim 12, wherein each of the first and second non-volatile memory devices outputs data in response to the read enable signal and a corresponding one of the first and second chip enable signals, wherein the controller is further configured to alternately receive the data output from the first non-volatile memory device and the data output from the second non-volatile memory device while the read enable signal is activated.

14. The apparatus of claim 12 wherein each of the first and second non-volatile memory devices inputs data in response to the write enable signal and a corresponding one of the first and second chip enable signals.

15. The apparatus of claim 12 wherein each of the first and second non-volatile memory devices is a NAND flash memory device.

16. The apparatus of claim 12 wherein the controller is a memory controller.

17. The apparatus of claim 12 wherein the controller is test equipment.

* * * * *